(12) United States Patent
Zhu et al.

(10) Patent No.: US 9,583,593 B2
(45) Date of Patent: Feb. 28, 2017

(54) FINFET AND METHOD OF MANUFACTURING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/723,226

(22) Filed: May 27, 2015

(65) Prior Publication Data

US 2015/0318390 A1   Nov. 5, 2015

Related U.S. Application Data

(63) Continuation of application No. PCT/CN2012/086523, filed on Dec. 13, 2012.

(30) Foreign Application Priority Data

Dec. 6, 2012   (CN) .......................... 2012 1 0520949

(51) Int. Cl.
*H01L 29/78* (2006.01)
*H01L 29/66* (2006.01)
(Continued)

(52) U.S. Cl.
CPC ..... *H01L 29/66545* (2013.01); *H01L 21/2815* (2013.01); *H01L 29/0649* (2013.01); (Continued)

(58) Field of Classification Search
CPC ................... H01L 29/0669; H01L 2221/1094; H01L 21/823431; H01L 27/0924; H01L 27/10826; H01L 29/41791; H01L 29/0673; H01L 29/6681; H01L 21/32139; H01L 29/66545; H01L 21/845; H01L 29/42392; H01L 21/02603
(Continued)

(56) References Cited

U.S. PATENT DOCUMENTS 6,413,802 B1   7/2002  Hu et al.
8,927,353 B2   1/2015  Hsu et al.
(Continued)

FOREIGN PATENT DOCUMENTS

CN       101303975 A    11/2008

OTHER PUBLICATIONS

International Search Report in International Application No. PCT/CN2012/086523, mailed Sep. 19, 2013.
(Continued)

*Primary Examiner* — Jarrett Stark
*Assistant Examiner* — Shahed Ahmed
(74) *Attorney, Agent, or Firm* — Knobbe, Martens, Olson & Bear, LLP

(57) ABSTRACT

A FinFET and a method of manufacturing the same are disclosed. The method includes forming a semiconductor fin. The method further includes forming a first region, the first region being one of a source region and a drain region. The method further includes forming a sacrificial spacer. The method further includes forming a second region with the sacrificial spacer as a mask, the second region being the other one of the source region and the drain region. The method further includes removing the sacrificial spacer. The method further includes replacing the sacrificial spacer with a gate stack comprising a gate conductor and a gate dielectric that separates the gate conductor from the semiconductor fin.

2 Claims, 14 Drawing Sheets

(51) Int. Cl.
*H01L 29/06* (2006.01)
*H01L 21/28* (2006.01)

(52) U.S. Cl.
CPC ...... *H01L 29/6653* (2013.01); *H01L 29/6681* (2013.01); *H01L 29/66795* (2013.01); *H01L 29/785* (2013.01)

(58) Field of Classification Search
USPC ......... 257/288, 368, 369; 438/151, 197, 199
See application file for complete search history.

(56) References Cited

U.S. PATENT DOCUMENTS

| | | |
|---|---|---|
| 2003/0127690 A1 | 7/2003 | Bryant et al. |
| 2005/0233565 A1 | 10/2005 | Zhu et al. |
| 2006/0194378 A1 | 8/2006 | Yagishita |
| 2007/0102772 A1 | 5/2007 | Lojek |
| 2009/0197383 A1 | 8/2009 | Kim et al. |
| 2013/0168744 A1* | 7/2013 | Hsu ................... H01L 21/82384 257/288 |
| 2014/0080275 A1* | 3/2014 | Harley .............. H01L 29/66545 438/283 |
| 2014/0131776 A1* | 5/2014 | Ching ............... H01L 29/66795 257/288 |

OTHER PUBLICATIONS

Chinese Office Action dated Feb. 3, 2016 for Chinese Application No. 201210520949.5.

* cited by examiner

US 9,583,593 B2

FINFET AND METHOD OF MANUFACTURING THE SAME

RELATED APPLICATIONS

This application claims priority to International Application No. PCT/CN2012/086523, filed on Dec. 13, 2012, entitled "FINFET AND MANUFACTURING METHOD THEREOF," and Chinese Application No. 201210520949.5, filed on Dec. 6, 2012, entitled "FINFET AND METHOD OF MANUFACTURING THE SAME," each of which is incorporated herein by reference in its entirety.

BACKGROUND

Field

The disclosed technology relates to semiconductor technology, and particularly to a FinFET and methods of manufacturing the same.

Description of the Related Technology

As planar semiconductor devices scale down, short-channel effects become increasingly significant. In order to address such problems, three-dimensional semiconductor devices such as fin field effect transistors (FinFETs) have been proposed. Generally, a FinFET includes a semiconductor fin in which a channel region may be formed, and a gate stack covering at least one sidewall of the fin. The gate stack intersects the fin, and includes a gate conductor and a gate dielectric. The gate dielectric isolates the gate conductor from the fin. The FinFET may have a double-gate, tri-gate, or annular-gate configuration. The fin has a small width (i.e., thickness), and thus the FinFET may improve control of carriers in the channel region by the gate conductor, and suppress short-channel effects.

A conventional process for manufacturing the gate stack includes depositing a dielectric layer and a conductor layer, and then patterning the gate stack by photolithography. However, as the size of devices decreases, it is increasingly difficult to form a gate of small size (i.e., length) in a length direction of the semiconductor fin. Therefore, there is a need for methods of manufacturing semiconductor devices including FinFETs with small gate sizes.

SUMMARY OF CERTAIN INVENTIVE ASPECTS

The disclosed technology includes FinFETs with reduced gate sizes, and methods of manufacturing the same.

One aspect of the disclosed technology is a method of manufacturing a FinFET. The method includes forming a semiconductor fin. The method further includes forming a first region, the first region being one of a source region and a drain region. The method further includes forming a sacrificial spacer. The method further includes forming a second region with the sacrificial spacer as a mask, the second region being the other one of the source region and the drain region. The method further includes removing the sacrificial spacer. The method further includes replacing the sacrificial spacer with a gate stack comprising a gate conductor and a gate dielectric that separates the gate conductor from the semiconductor fin.

Another aspect of the disclosed technology is a FinFET. The FinFET includes a semiconductor fin. The FinFET further includes a source region and a drain region disposed in the semiconductor fin. The FinFET further includes a shielding layer disposed on one of the source region and the drain region, the shielding layer having a sidewall opposed to the other one of the source region and the drain region. The FinFET further includes a gate stack disposed between the source region and the drain region, the gate stack comprising a gate dielectric and a gate conductor that separates the gate conductor from the semiconductor fin.

In an embodiment, the gate stack is formed with aid of the sacrificial spacer, such that a gate length much smaller than that of conventional FinFETs can be achieved. In an embodiment, the second region is formed with the sacrificial spacer as a mask, and thus the gate stack may be substantially aligned to the source region and the drain region. Therefore, it is possible to reduce the use of masks and the requirement for complicated photolithography processes, and thus reduce the cost of manufacturing FinFETs.

BRIEF DESCRIPTION OF THE DRAWINGS

The foregoing and other objects, features, and advantages of the disclosed technology will become more apparent from the following descriptions of embodiments taken in conjunction with the accompanying drawings.

DETAILED DESCRIPTION OF CERTAIN INVENTIVE ASPECTS

Figure 1:
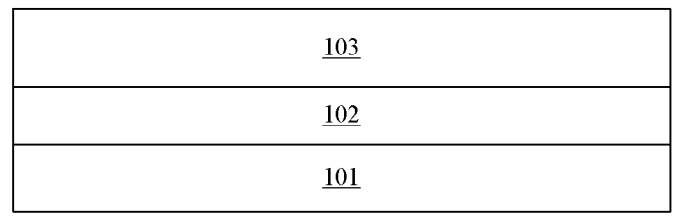
FIG. 1 is a cross sectional view in a width direction of a semiconductor fin during an intermediate step of a method of manufacturing a FinFET device in an embodiment of the disclosed technology.

Hereinafter, the disclosed technology will be explained in detail with reference to the drawings. Like components are indicated by like reference numerals throughout the drawings. The drawings are not necessarily drawn to scale for purpose of clarity. A semiconductor structure obtained by several steps may be illustrated in a single figure for conciseness.

In descriptions of structures, when one layer or region is referred to as being "above" or "on" another layer or region, it can be directly above or on the other layer or region, or other layer(s) or region(s) may be arranged therebetween. Moreover, if the structure in the figures is turned over, the layer or region will be "under" or "below" the other layer or region. In order to illustrate a situation in which one layer or region is directly on another layer or region, expressions such as "directly on" or "on and abutting/adjoining" may be utilized.

In the disclosed technology, the term "semiconductor structure" refers generally to an entire semiconductor structure formed through various steps which have been performed in a flow of manufacturing a semiconductor device, including all of the layers and regions that have been formed. In the following, some particular details of the disclosure, such as structures, materials, dimensions, process steps and technologies, will be described for a better understanding of the disclosed technology. Nevertheless, it should be understood by one skilled in the art that the disclosure can be implemented without these details.

Unless indicated otherwise, each part of a FinFET can be made of material(s) known to a skilled person in the art. A semiconductor material may comprise, for example, a III-V group semiconductor material such as GaAs, InP, GaN and SiC, or a IV group semiconductor such as Si and Ge. A gate conductor may comprise any of various conductive materials, for example, metal, doped polysilicon, a multilayer gate conductor including a metal layer and a doped polysilicon layer, or any other conductive material, such as TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, HfRu, RuOx, or any combination thereof. A gate dielectric may comprise $SiO_2$ or any other dielectric material which has a dielectric constant greater than that of $SiO_2$, such as oxide, nitride, oxynitride, silicate, aluminate, or titanate. The oxide may include, for example, $SiO_2$, $HfO_2$, $ZrO_2$, $Al_2O_3$, $TiO_2$, or $La_2O_3$. The nitride may include, for example, $Si_3N_4$. The silicate may include, for example, $HfSiO_x$. The aluminate may include, for example, $LaAlO_3$. The titanate may include, for example, $SrTiO_3$. The oxynitride may include, for example, SiON. Moreover, the gate dielectric may comprise any material that will be developed in the future, besides the above known materials.

In a conventional gate last process (i.e., replacement gate process), after a source region and a drain region are manufactured in a substrate with aid of a "dummy" gate stack and spacers on opposite sides of the dummy gate stack, the spacers are preserved to define a hole between the spacers, and a real gate stack is formed by filling the hole. In contrast, the disclosed technology provides a "replacement spacer" process, in which after the source and drain regions are formed, a material layer disposed at a side of one of the source and drain regions is preserved, and a gate stack (particularly, a gate conductor) is formed as a spacer on a sidewall of the preserved material layer. Accordingly, the gate stack may be formed in a relatively large space (particularly, a region substantially equal to the gate region combined with the other one of the source and drain regions), and thus the process may be more easily implemented than conventional processes in which the gate stack is formed in only a small gate opening between the spacers.

A method of manufacturing a FinFET according to an embodiment of the disclosed technology will be illustrated with reference to the figures, in which FIGS. 4C, 5C, 6C, 7C, 8C, 9C, and 10c show top views of respective semiconductor structures and section lines A-A and B-B, along which sectional views are taken. FIGS. 1-3, 4A, 5A, 6A, 7A, 8A, 9A, and 10A illustrate sectional views taken along line A-A in a width direction of a semiconductor fin. FIGS. 4B, 5B, 6B, 7B, 8B, 9B, and 10B illustrate sectional views taken along line B-B in a length direction of the semiconductor fin.

FIG. 1 is a cross sectional view in a width direction of a semiconductor fin during an intermediate step of a method of manufacturing a FinFET device in an embodiment of the disclosed technology. A semiconductor substrate is an initial structure. The semiconductor structure comprises, from the bottom up, a conventional silicon on insulator (SOI) wafer, including a semiconductor substrate 101, a buried insulating layer 102 and a semiconductor layer 103. The semiconductor layer 103 may have a thickness of about 5 nm-20 nm, such as 10 nm or 15 nm, and the buried insulating layer 102 may have a thickness of about 5 nm-30 nm, such as 10 nm, 15 nm, 20 nm or 25 nm.

The semiconductor substrate 101 may comprise bulk silicon, a IV Group semiconductor material, such as SiGe or Ge, or a III-V Group compound semiconductor material, such as gallium arsenide.

The buried insulating layer 102 may comprise a buried oxide layer, a buried nitride layer or other buried insulating layer.

The semiconductor layer 103 will be used to form a semiconductor fin and provide source and drain regions and a channel region of the FinFET therein. The semiconductor layer 103 may comprise a semiconductor material selected from a IV Group semiconductor material such as Si, Ge or SiGe, or a III-V Group compound semiconductor material such as gallium arsenide. In this embodiment, the semiconductor layer 103 may comprise monocrystalline Si or SiGe.

A process for forming the above described SOI wafer is well known. For example, a SmartCut™ method may be used. The SmartCut™ method comprises bonding two wafers, each of which has an oxide surface layer formed through thermal oxidation or deposition. Hydrogen implantation has been applied to one of the two wafers, such that a hydrogen implanted region is formed in the silicon body under the oxide surface layer at a certain depth. Then the hydrogen implanted region is transformed to a layer of micro cavities as the pressure or temperature increases, facilitating portions on opposite sides of the micro cavity layer to be separated from each other. After the cut, a portion containing the bonded oxide surface layers is used as the SOI wafer. The thickness of the buried insulating layer in the SOI wafer may be changed by controlling process parameters of the thermal oxidation or deposition. The thickness of the semiconductor layer in the SOI wafer may be changed by controlling the energy of the hydrogen implantation.

Figure 2:
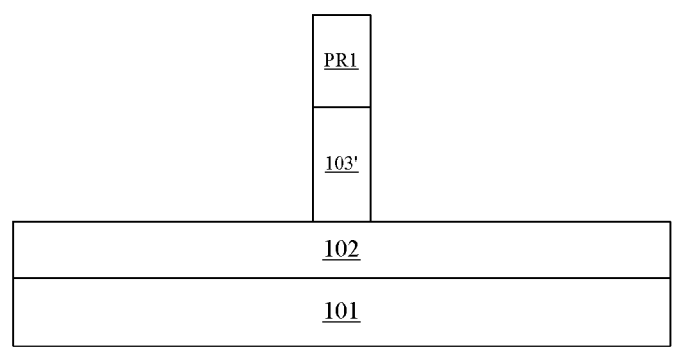
FIG. 2 is a cross sectional view in a width direction of a semiconductor fin during an intermediate step of a method of manufacturing a FinFET device in an embodiment of the disclosed technology.

FIG. 2 is a cross sectional view in a width direction of a semiconductor fin during an intermediate step of a method of manufacturing a FinFET device in an embodiment of the disclosed technology. The semiconductor substrate 103 is patterned to form a semiconductor fin 103', as illustrated in FIG. 2. The patterning may include forming a patterned photoresist mask PR1 on the semiconductor substrate 103 by photolithography including exposure and development, and removing exposed portions of the semiconductor substrate 103 through dry etching, such as ion milling, plasma etching, reactive ion etching (RIE), and laser ablation, or wet etching using an etchant solution. The etching stops on the top of the buried insulating layer 102.

Figure 3:
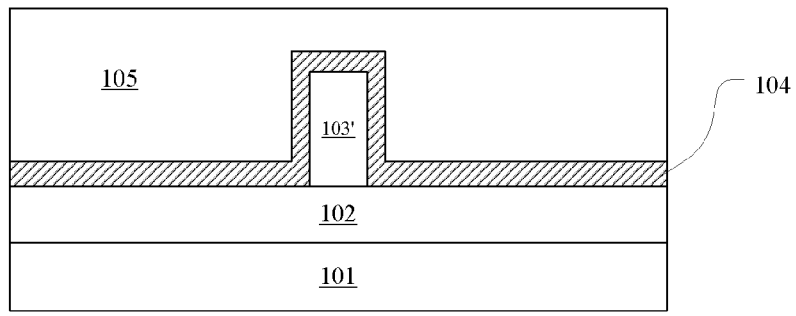
FIG. 3 is a cross sectional view in a width direction of a semiconductor fin during an intermediate step of a method of manufacturing a FinFET device in an embodiment of the disclosed technology.

FIG. 3 is a cross sectional view in a width direction of a semiconductor fin during an intermediate step of a method of manufacturing a FinFET device in an embodiment of the disclosed technology. The photoresist mask PR1 is removed by being ashed or dissolved in a solution. Then a conformal oxide layer 104 and a first shielding layer 105 (e.g., silicon nitride) overlaid thereon are formed on the surface of the semiconductor structure by a known deposition process, such as chemical vapor deposition (CVD), physical vapor deposition (PVD), atom layer deposition, sputtering, or the like, as illustrated in FIG. 3. The surface of the semiconductor structure may be planarized by, for example, chemical mechanical polishing (CMP). By controlling the duration of the CMP, only a part of the first shielding layer 105 is removed while the oxide layer 104 is not reached. For facilitating the formation of a sacrificial spacer on the semiconductor fin 103', it is desirable to the preserved part of the first shielding layer 105 has a thickness large enough to provide a sidewall on which the sacrificial spacer is formed. Furthermore, the first shielding layer 105 also provides a mechanical support for the semiconductor fin 103'. The first shielding layer 105 has a thickness at least about 2 times larger than the height of the semiconductor fin 103'.

Figure 4A:
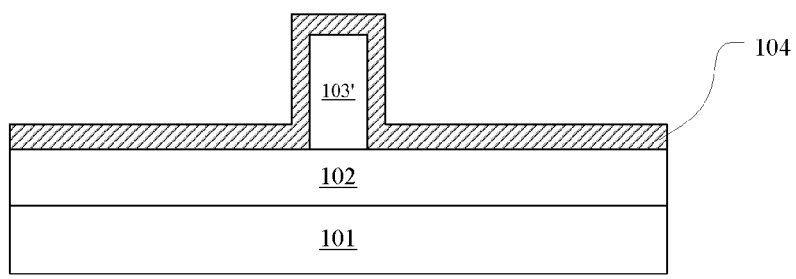
FIG. 4A is a cross sectional view in a width direction of a semiconductor fin during an intermediate step of a method of manufacturing a FinFET device in an embodiment of the disclosed technology.
Figure 4B:
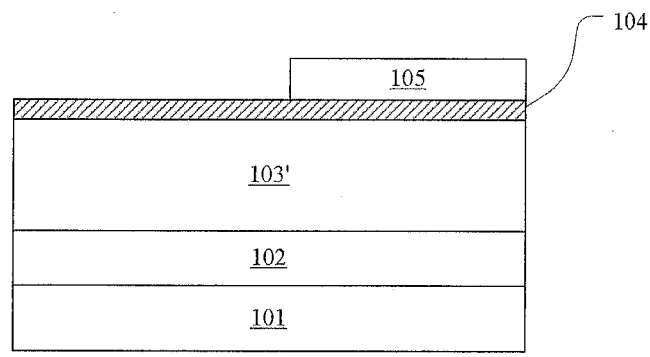
FIG. 4B is a cross sectional view in a length direction of a semiconductor fin during an intermediate step of a method of manufacturing a FinFET device in an embodiment of the disclosed technology.
Figure 4C:
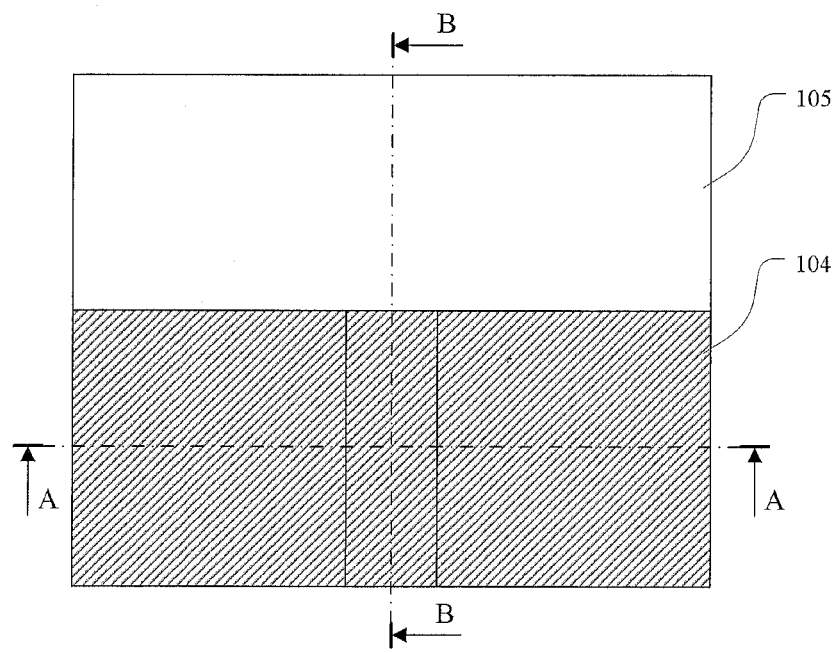
FIG. 4C is a top view, with section line AA in a width direction and section line BB in a length direction, of a semiconductor fin during an intermediate step of a method of manufacturing a FinFET device in an embodiment of the disclosed technology.

FIG. 4A is a cross sectional view in a width direction, FIG. 4B is a cross sectional view in a length direction, and FIG. 4C is a top view of a semiconductor fin during an intermediate step of a method of manufacturing a FinFET device in an embodiment of the disclosed technology. Section lines AA and BB in FIG. 4C correspond to the cross sectional views of FIGS. 4A and 4B, respectively. The first shielding layer 105 is patterned through any of the above described patterning processes by using a photoresist mask, in order to expose a portion of the semiconductor fin 103' where one of the source region and the drain region is to be formed, as illustrated in FIGS. 4A, 4B and 4C. In the patterning process, exposed portions of the first shielding layer 105 are selectively removed with respect to the oxide layer 104. The patterned first shielding layer 105 has a sidewall extending along a direction perpendicular to the length direction of the semiconductor fin 103'.

Figure 5A:
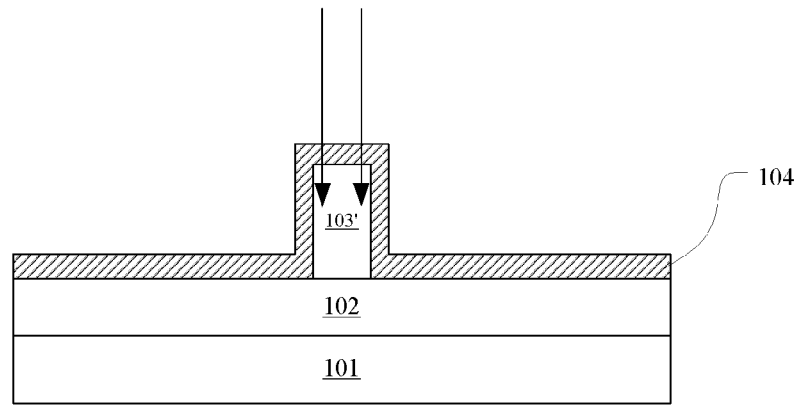
FIG. 5A is a cross sectional view in a width direction of a semiconductor fin during an intermediate step of a method of manufacturing a FinFET device in an embodiment of the disclosed technology.
Figure 5B:
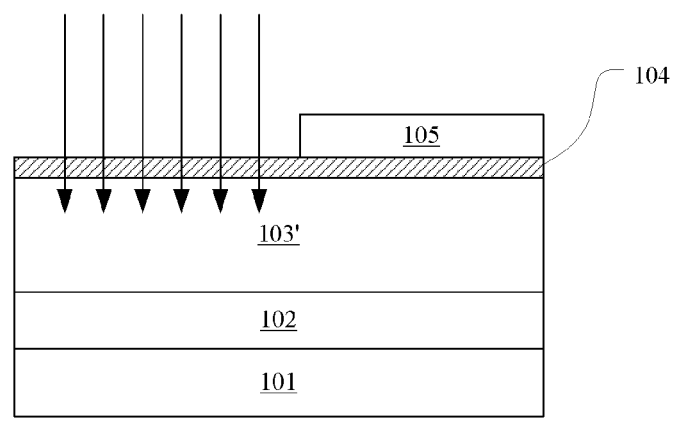
FIG. 5B is a cross sectional view in a length direction of a semiconductor fin during an intermediate step of a method of manufacturing a FinFET device in an embodiment of the disclosed technology.
Figure 5C:
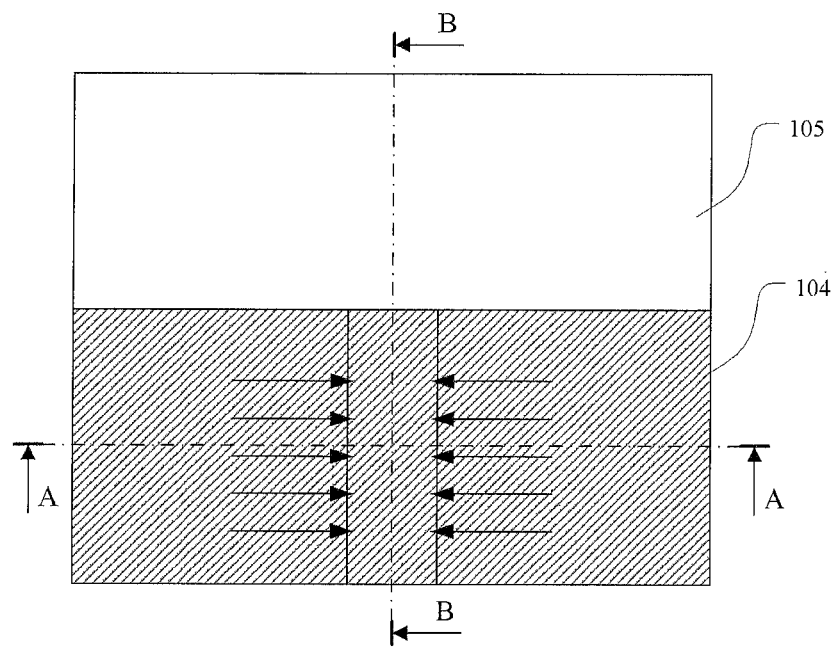
FIG. 5C is a top view, with section line AA in a width direction and section line BB in a length direction, of a semiconductor fin during an intermediate step of a method of manufacturing a FinFET device in an embodiment of the disclosed technology.

FIG. 5A is a cross sectional view in a width direction, FIG. 5B is a cross sectional view in a length direction, and FIG. 5C is a top view of a semiconductor fin during an intermediate step of a method of manufacturing a FinFET device in an embodiment of the disclosed technology. Section lines AA and BB in FIG. 5C correspond to the cross sectional views of FIGS. 5A and 5B, respectively. The first region, where the first region is one of the source region and the drain region (not shown), is formed by conducting a first ion implantation into the semiconductor fin 103' with the first shielding layer 105 as a hard mask, as illustrated in FIGS. 5A, 5B and 5C. During the first ion implantation, for a p-type device, p-type dopants such as In, $BF_2$, or B may be implanted, while for an n-type device, n-type dopants such as As or P may be implanted.

Additional ion implantations may be conducted to form extension and halo regions if desired. During the additional ion implantation for forming the extension region, the p-type dopants as described above can be implanted for the p-type device, while, the n-type dopants as described above can be implanted for the n-type device. During the additional ion implantation for forming the halo region, the n-type dopants as described above can be implanted for the p-type device, while the p-type dopants as described above can be implanted for the n-type device.

In an embodiment, after the first ion implantation, the implanted dopants may be activated by annealing such as peak annealing, laser annealing, or rapid annealing.

Figure 6A:
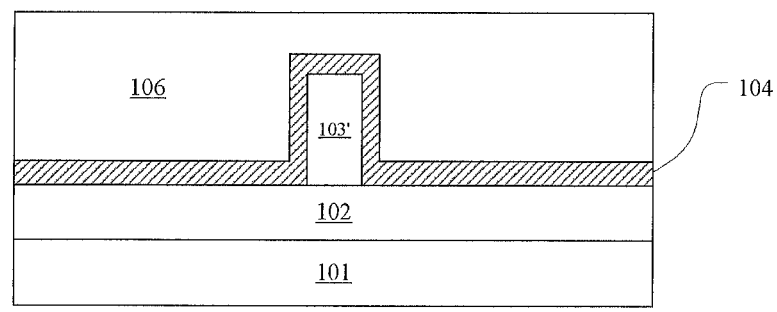
FIG. 6A is a cross sectional view in a width direction of a semiconductor fin during an intermediate step of a method of manufacturing a FinFET device in an embodiment of the disclosed technology.
Figure 6B:
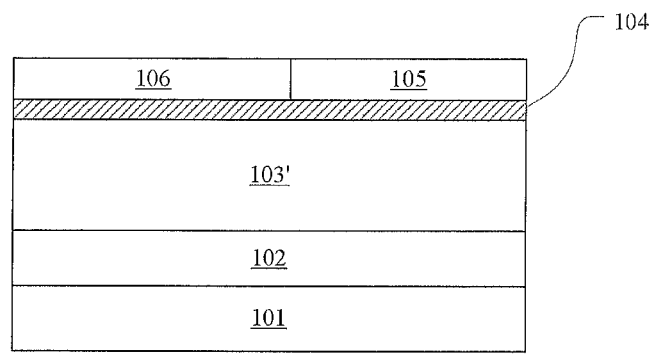
FIG. 6B is a cross sectional view in a length direction of a semiconductor fin during an intermediate step of a method of manufacturing a FinFET device in an embodiment of the disclosed technology.
Figure 6C:
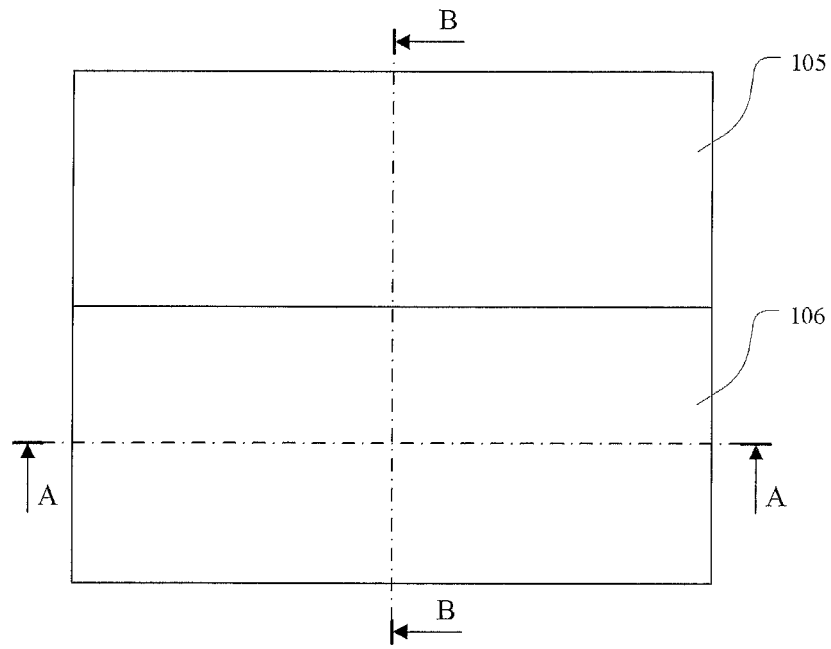
FIG. 6C is a top view, with section line AA in a width direction and section line BB in a length direction, of a semiconductor fin during an intermediate step of a method of manufacturing a FinFET device in an embodiment of the disclosed technology.

FIG. 6A is a cross sectional view in a width direction, FIG. 6B is a cross sectional view in a length direction, and FIG. 6C is a top view of a semiconductor fin during an intermediate step of a method of manufacturing a FinFET device in an embodiment of the disclosed technology. Section lines AA and BB in FIG. 6C correspond to the cross sectional views of FIGS. 6A and 46B, respectively. A second shielding layer 106 (e.g., silicon oxide) is deposited on the semiconductor structure through, for example, any of the above described deposition processes. Then planarization process such as CMP may be performed to obtain a flat surface of the semiconductor structure, as illustrated in FIGS. 6A, 6B and 6C. The CMP uses the first shielding layer 105 as a stop layer. As a result, the second shielding layer 106 and the first shielding layer 105 adjoin each other, and cover the portion of the semiconductor fin 103' where the one of the source region and the drain region has been formed and also a portion of the semiconductor fin 103' where the other one of the source region and the drain region is to be formed.

Figure 7A:
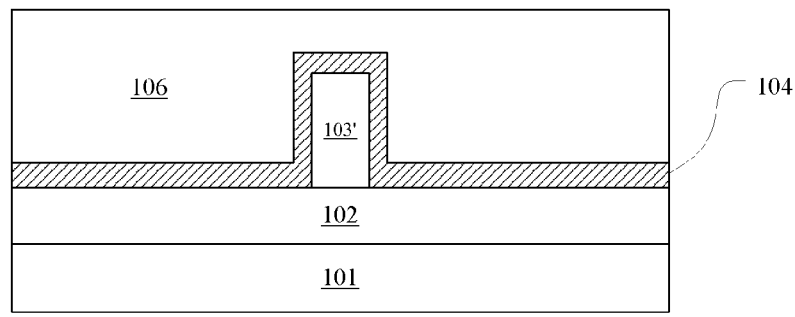
FIG. 7A is a cross sectional view in a width direction of a semiconductor fin during an intermediate step of a method of manufacturing a FinFET device in an embodiment of the disclosed technology.
Figure 7B:
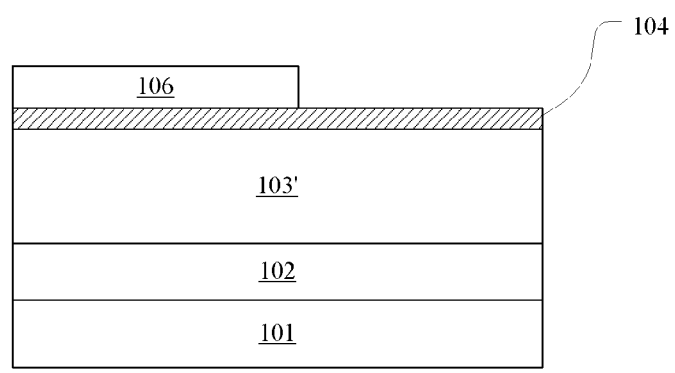
FIG. 7B is a cross sectional view in a length direction of a semiconductor fin during an intermediate step of a method of manufacturing a FinFET device in an embodiment of the disclosed technology.
Figure 7C:
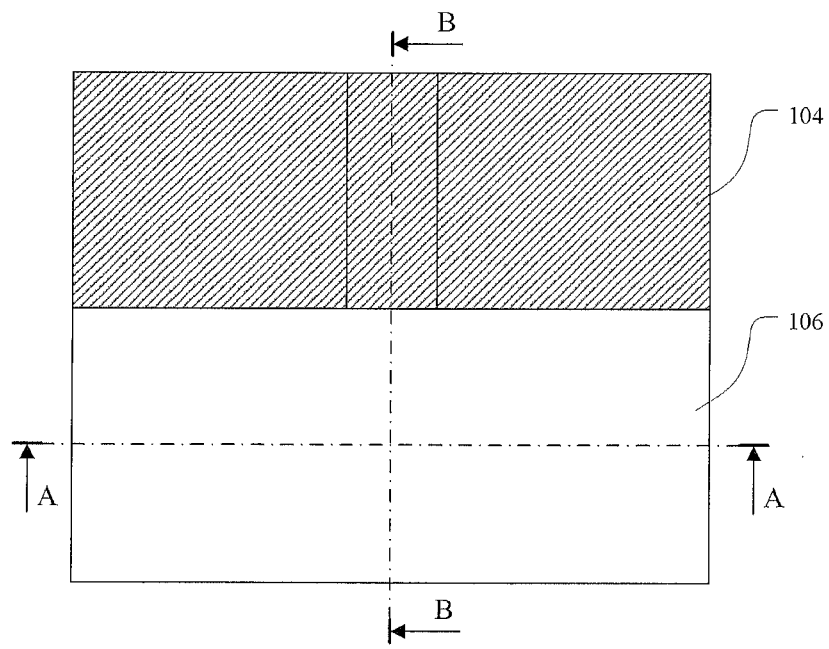
FIG. 7C is a top view, with section line AA in a width direction and section line BB in a length direction, of a semiconductor fin during an intermediate step of a method of manufacturing a FinFET device in an embodiment of the disclosed technology.

FIG. 7A is a cross sectional view in a width direction. FIG. 7B is a cross sectional view in a length direction, and FIG. 7C is a top view of a semiconductor fin during an intermediate step of a method of manufacturing a FinFET device in an embodiment of the disclosed technology. Section lines AA and BB in FIG. 7C correspond to the cross sectional views of FIGS. 7A and 7B, respectively. The first shielding layer 105 is selectively removed with respect to the adjacent second shielding layer 106 and the underlying oxide layer 104 through selective dry etching or wet etching such as RIE, as illustrated in FIGS. 7A, 7B and 7C. The etching exposes a sidewall of the second shielding layer 106, and does not require any additional photoresist mask.

Figure 8A:
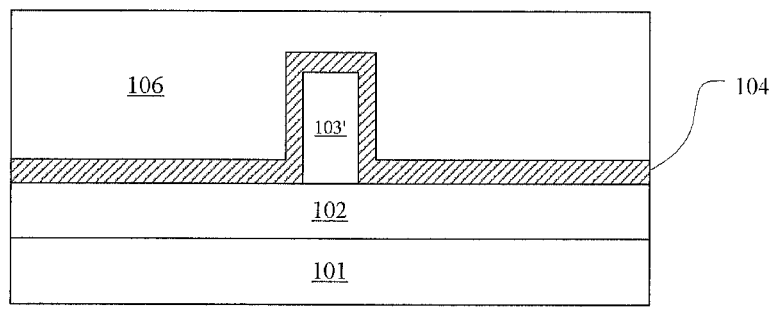
FIG. 8A is a cross sectional view in a width direction of a semiconductor fin during an intermediate step of a method of manufacturing a FinFET device in an embodiment of the disclosed technology.
Figure 8B:
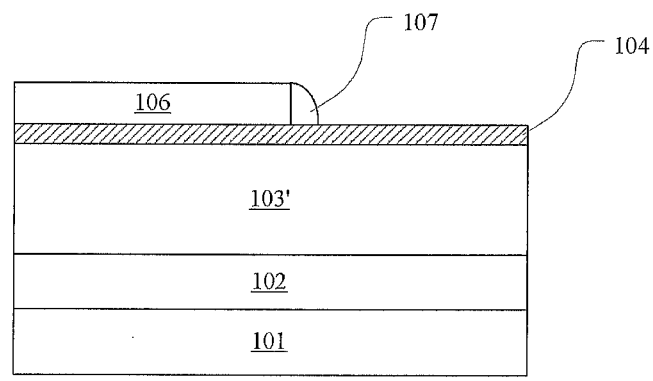
FIG. 8B is a cross sectional view in a length direction of a semiconductor fin during an intermediate step of a method of manufacturing a FinFET device in an embodiment of the disclosed technology.
Figure 8C:
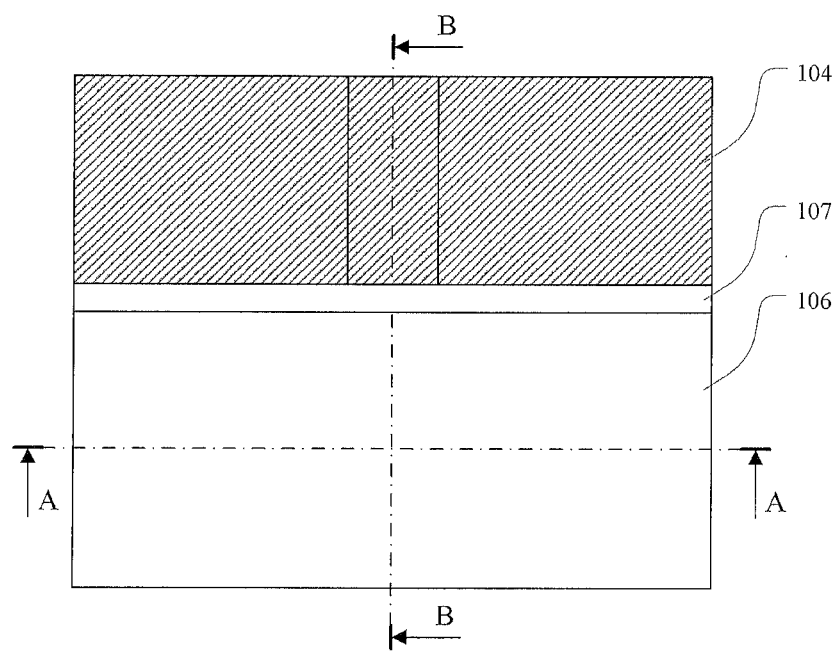
FIG. 8C is a top view, with section line AA in a width direction and section line BB in a length direction, of a semiconductor fin during an intermediate step of a method of manufacturing a FinFET device in an embodiment of the disclosed technology.

FIG. 8A is a cross sectional view in a width direction, FIG. 8B is a cross sectional view in a length direction, and FIG. 8C is a top view of a semiconductor fin during an intermediate step of a method of manufacturing a FinFET device in an embodiment of the disclosed technology. Section lines AA and BB in FIG. 8C correspond to the cross sectional views of FIGS. 8A and 8B, respectively. A nitride layer with a thickness of e.g., 10 nm-50 nm is deposited on the surface of the semiconductor structure through any of the above described known deposition processes, and then a sacrificial spacer 107 is formed on the sidewall of the second shielding layer 106 though anisotropic etching, as illustrated in FIGS. 8a, 8b and 8c. The sacrificial spacer 107 may be formed of a material like a conventional gate spacer, and the sacrificial spacer 107 extends along a direction perpendicular to the length direction of the semiconductor fin 103'. As will be described below, the sacrificial spacer 107 will be removed and replaced with a gate stack.

Figure 9A:
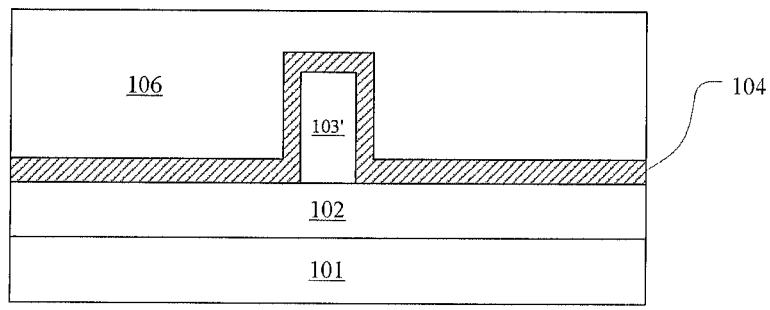
FIG. 9A is a cross sectional view in a width direction of a semiconductor fin during an intermediate step of a method of manufacturing a FinFET device in an embodiment of the disclosed technology.
Figure 9B:
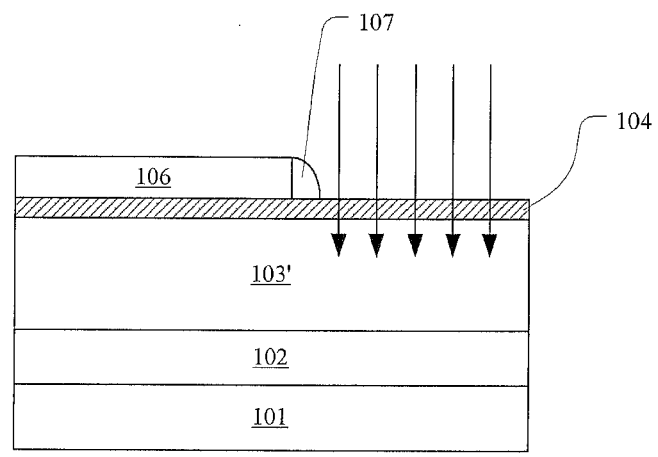
FIG. 9B is a cross sectional view in a length direction of a semiconductor fin during an intermediate step of a method of manufacturing a FinFET device in an embodiment of the disclosed technology.
Figure 9C:
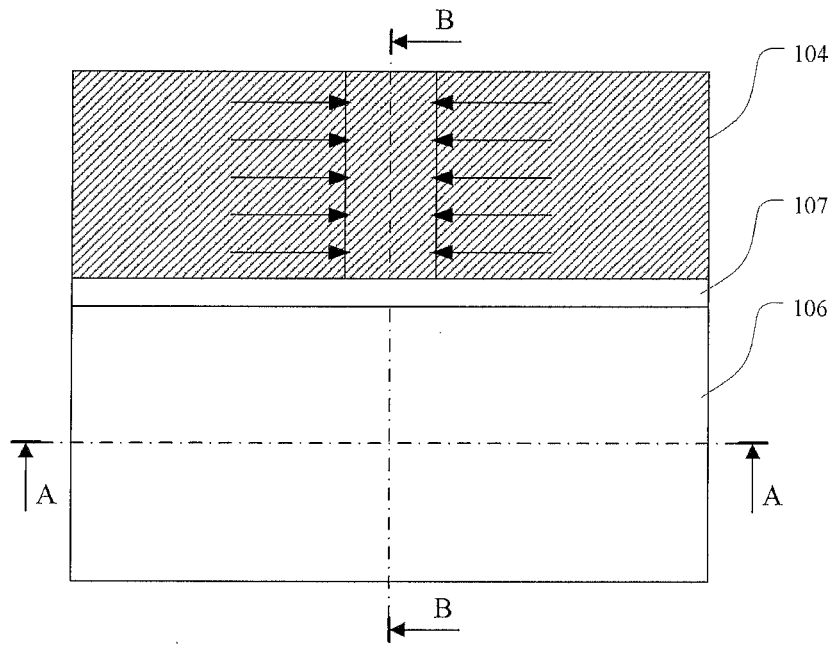
FIG. 9C is a top view, with section line AA in a width direction and section line BB in a length direction, of a semiconductor fin during an intermediate step of a method of manufacturing a FinFET device in an embodiment of the disclosed technology.

FIG. 9A is a cross sectional view in a width direction, FIG. 9B is a cross sectional view in a length direction, and FIG. 9C is a top view of a semiconductor fin during an intermediate step of a method of manufacturing a FinFET device in an embodiment of the disclosed technology. Section lines AA and BB in FIG. 9C correspond to the cross sectional views of FIGS. 9A and 9B, respectively. The other one of the source region and the drain region (second region, not shown) is formed by conducting a second ion implantation into the semiconductor fin 103' with the second shielding layer 106 and the sacrificial spacer 107 as a hard mask, as illustrated in FIGS. 9a, 9b and 9c. During the second ion implantation, the p-type dopants as described above may be implanted for a p-type device, while the n-type dopants as described above may be implanted for an n-type device.

Additional ion implantations may be conducted to form extension and halo regions if desired. During the additional ion implantation for forming the extension region, the p-type dopants as described above can be implanted for the p-type device, while the n-type dopants as described above can be implanted for the n-type device. During the additional ion implantation for forming the halo region, the n-type dopants as described above can be implanted for the p-type device, while the p-type dopants as described above can be implanted for the n-type device.

In an embodiment, after the second ion implantation, the implanted dopants may be activated by annealing such as peak annealing, laser annealing, or rapid annealing.

Figure 10A:
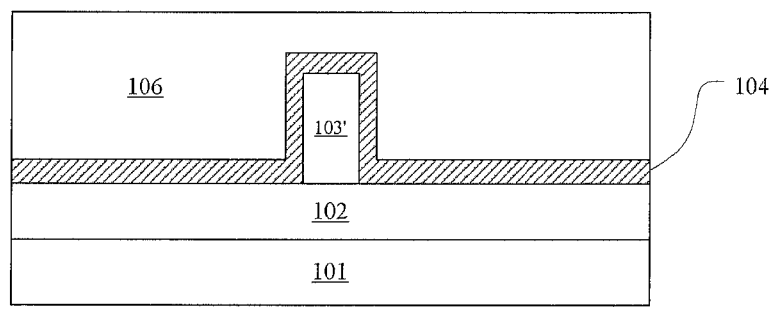
FIG. 10A is a cross sectional view in a width direction of a semiconductor fin during an intermediate step of a method of manufacturing a FinFET device in an embodiment of the disclosed technology.
Figure 10B:
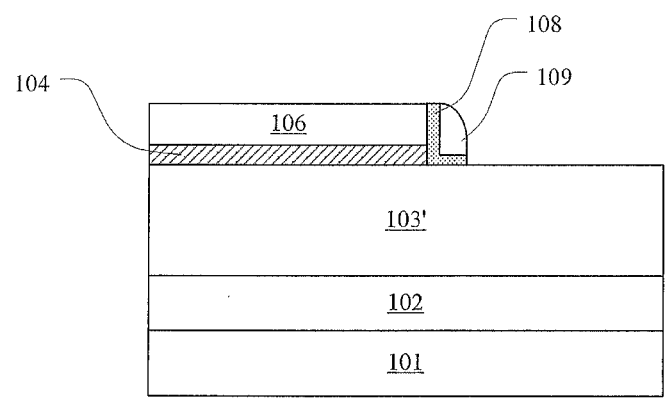
FIG. 10B is a cross sectional view in a length direction of a semiconductor fin during an intermediate step of a method of manufacturing a FinFET device in an embodiment of the disclosed technology.
Figure 10C:
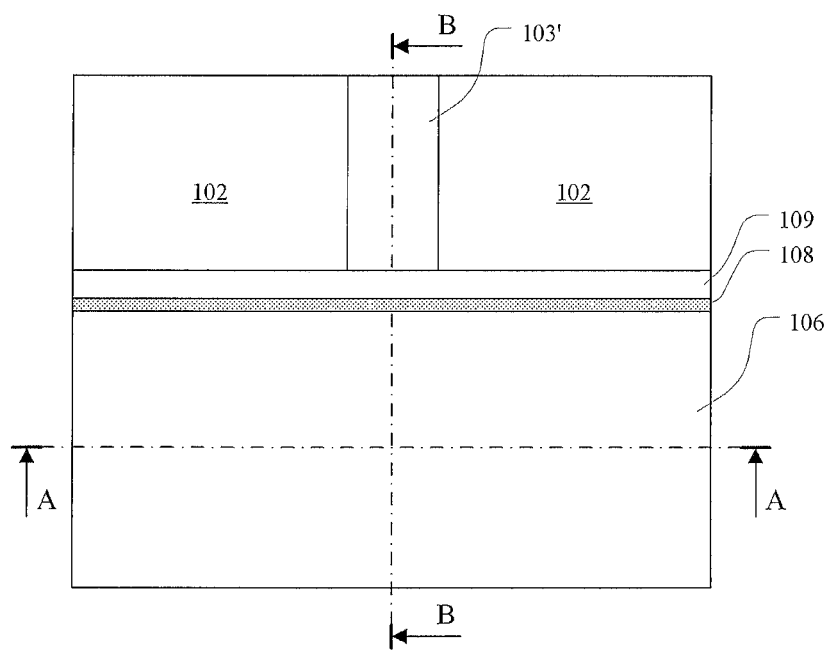
FIG. 10C is a top view, with section line AA in a width direction and section line BB in a length direction, of a semiconductor fin during an intermediate step of a method of manufacturing a FinFET device in an embodiment of the disclosed technology.

FIG. 10A is a cross sectional view in a width direction, FIG. 10B is a cross sectional view in a length direction, and FIG. 10C is a top view of a semiconductor fin during an intermediate step of a method of manufacturing a FinFET device in an embodiment of the disclosed technology. Section lines AA and BB in FIG. 10C correspond to the cross sectional views of FIGS. 4A and 4B, respectively. The sacrificial spacer 107 is selectively removed with respect to the adjacent second shielding layer 106 and the underlying oxide layer 104 through any of the above described dry etching or wet etching processes, such as RIE, by using a suitable etchant. After the sacrificial spacer 107 is completely removed, a portion of the underlying oxide layer 104 which is not shielded by the adjacent second shielding layer 106 is further removed by using a suitable etchant. When removing the underlying oxide layer 104, the adjacent second shielding layer 106 also may be etched. Since the second shielding layer 106 may have a thickness much greater than that of the oxide layer 104, the second shielding layer 106 still exists after the etching but the thickness of the second shielding layer 106 is slightly reduced. This may be achieved by controlling the etching duration.

Then, a dielectric layer (e.g., $HfO_2$) and a gate conductor layer (e.g., polycrystalline silicon) are conformally formed in this order on the surface of the semiconductor structure through a known deposition process. Anisotropic etching is conducted on the conductor layer to remove a portion of the conductor layer that extends in parallel with the main surface of the semiconductor substrate 101. A portion of the gate conductor layer that extends vertically on the sidewall of the second shielding layer 106 is preserved to form a gate conductor 109 as a spacer. Further, exposed portions of the dielectric layer are selectively removed with respect to the gate conductor 109 and the second shielding layer 106, with the gate conductor 109 as a hard mask and using a suitable etchant, to form a gate dielectric 108. The gate stack comprises the gate dielectric 108 and the gate conductor 109, wherein the gate conductor 109 is separated from the semiconductor fin 103' by the gate dielectric 108, as illustrated in FIGS. 10a, 10b and 10c.

The dielectric layer has a thickness of about 2 nm-5 nm. The gate conductor layer has a thickness of about 10 nm-45 nm. As a result, by controlling the thickness of the gate conductor layer, the resultant gate conductor 109 is substantially aligned to the sacrificial spacer 107 as shown in FIGS. 8a, 8b and 8c, and thus the resultant gate conductor 109 is substantially aligned between the source region and the drain region.

In an embodiment, it is also possible to form a work function adjustment layer (not shown) between the gate conductor 109 and the gate dielectric 108. For example, the work function adjustment layer may comprise any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, Ni$_3$Si, Pt, Ru, Ir, Mo, HfRu, and RuO$_x$, or any combination thereof. The work function adjustment layer may have a thickness of about 2 nm-10 nm. One of ordinary skill in the art will understand that the work function adjustment layer is optional. The gate stack including the work function adjustment layer, e.g., HfO$_2$/TiN/polysilicon, may advantageously achieve a decreased gate leakage current.

After the gate stack comprising the gate dielectric 108 and the gate conductor 109 is formed, one sidewall of the gate conductor 109 abuts the sidewall of the second shielding layer 106, while another sidewall of the gate conductor 109 is exposed. Further, a conformal nitride layer, e.g., silicon nitride, may be formed on the surface of the semiconductor structure and then patterned into a spacer (not shown) through anisotropic etching, following conventional steps, such as those for forming the sacrificial spacer 107 as described with reference to FIGS. 8a, 8b and 8c. The exposed sidewall of the gate conductor 109 is covered by this nitride layer, such that the gate conductor 109 is electrically isolated from the adjacent source region or drain region and a conductive via. After the step as shown in FIG. 10, an interlayer insulating layer, conductive vias disposed in the interlayer insulating layer and wires or electrodes disposed on an upper surface of the interlayer insulating layer are formed on the resultant semiconductor structure, to complete the FinFET.

Figure 11:
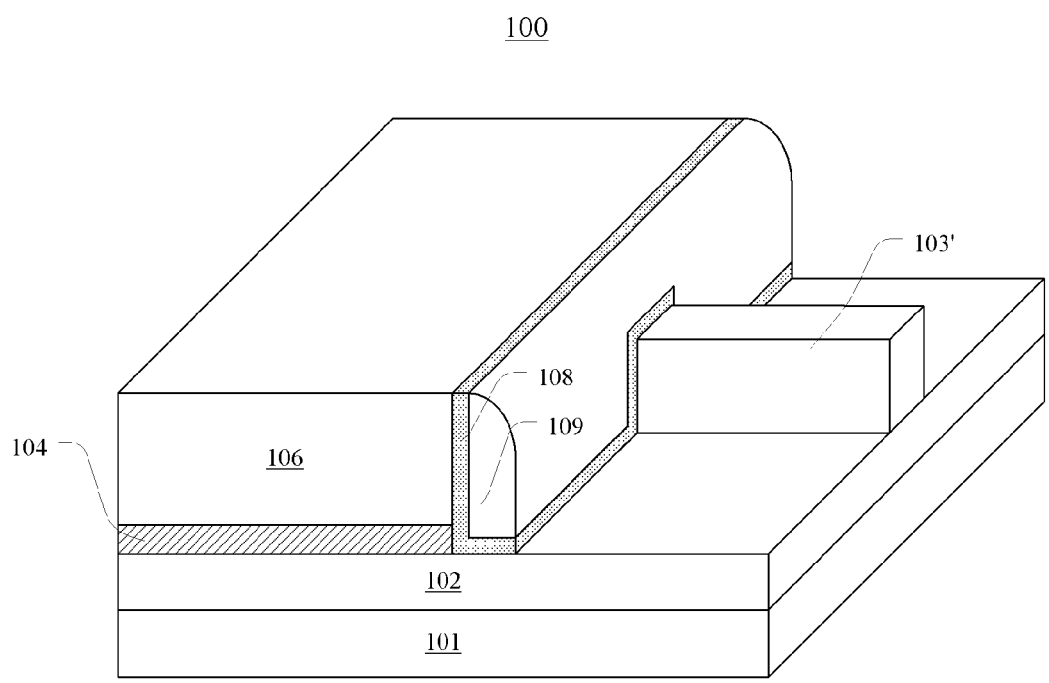
FIG. 11 is a perspective view showing a FinFET in accordance with an embodiment of the disclosed technology.

FIG. 11 is a perspective view illustrating a FinFET 100 in accordance with an embodiment of the disclosed technology. The FinFET 100 is formed on, for example, a SOI wafer. The SOI wafer comprises a semiconductor substrate 101, a buried insulating layer 102 and a semiconductor layer 103, wherein the buried insulating layer 102 is disposed between the semiconductor substrate 101 and the semiconductor layer 103. The semiconductor fin 103' is formed by the semiconductor layer 103. The FinFET 100 comprises a source region and a drain region (not shown) formed in different portions of the semiconductor fin 103', respectively. An oxide layer 104 and a second shielding layer 106 are disposed on top of one of the source region and the drain region. The oxide layer 104 and the second shielding layer 106 constitute a part of an interlayer layer. The oxide layer 104 and the second shielding layer 106 each has a sidewall opposed to the other one of the source region and the drain region, to provide mechanical support for a gate stack. The gate stack comprises a gate dielectric 108 and a gate conductor 109. The gate dielectric 108 separates the gate conductor 109 from the semiconductor fin 103', and comprises a first portion disposed on the sidewall of the second shielding layer 106 and a second portion disposed on the semiconductor fin 103'. In other words, a cross section of the gate dielectric 108 extending along a direction in parallel with the length direction of the semiconductor fin 103' and passing through the semiconductor fin 103' is in L shape. The gate stack is substantially aligned to the source region and the drain region, and the gate stack intersects with the semiconductor fin 103'. For example, the gate stack extends along a direction perpendicular to the length direction of the semiconductor fin 103'.

Figure 12:
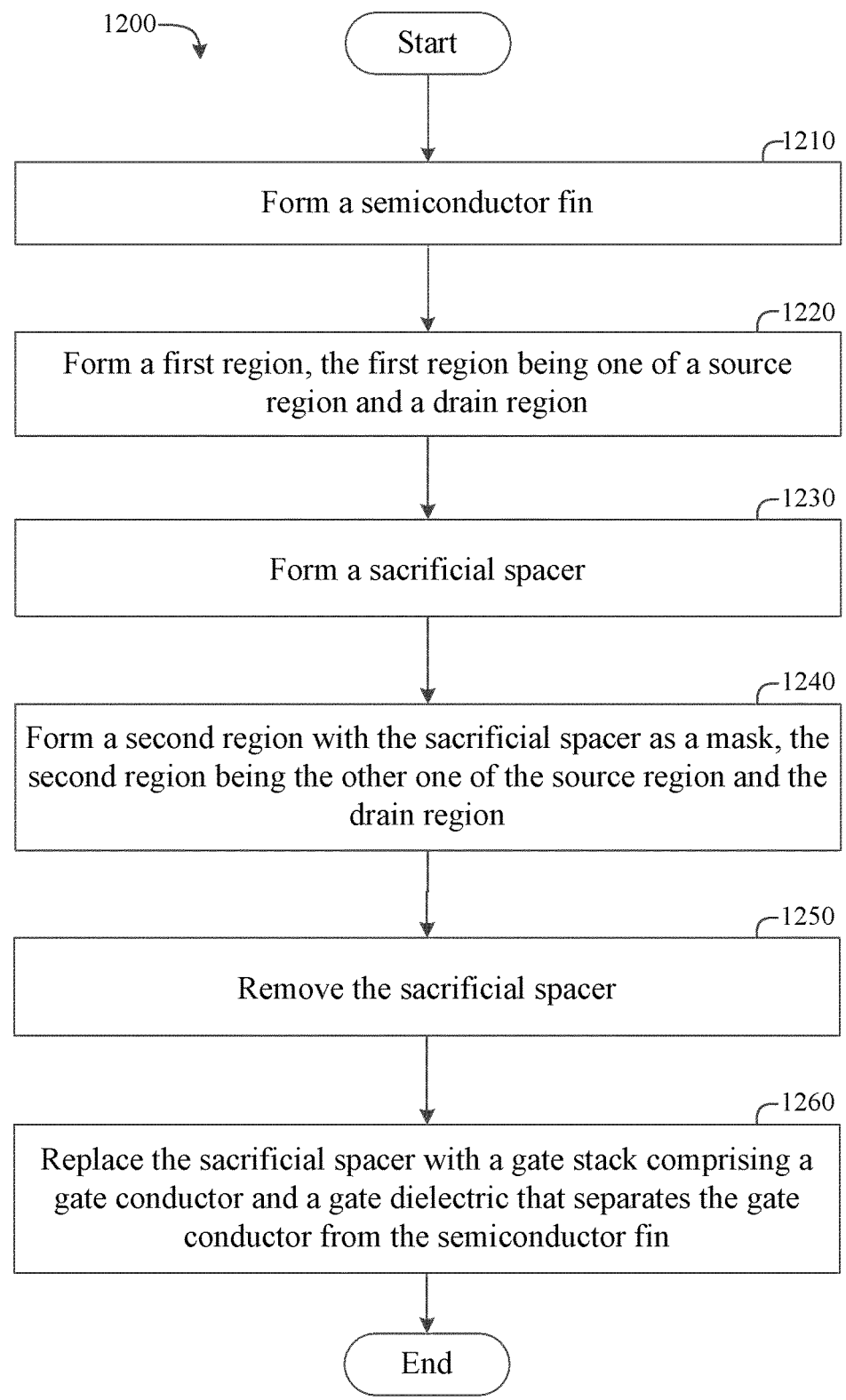
FIG. 12 is a flowchart illustrating a method of manufacturing a FinFET in an embodiment of the disclosed technology.

FIG. 12 is a flowchart illustrating a method 1200 of manufacturing a FinFET in an embodiment of the disclosed technology. In block 1210, method 1200 involves forming a semiconductor fin. In block 1220, method 1200 involves forming a first region, the first region being one of a source region and a drain region. In block 1230, method 1200 involves forming a sacrificial spacer. In block 1240, method 1200 involves forming a second region with the sacrificial spacer as a mask, the second region being the other one of the source region and the drain region. In block 1250, method 1200 involves removing the sacrificial spacer. In block 1260, method 1200 involves replacing the sacrificial spacer with a gate stack comprising a gate conductor and a gate dielectric that separates the gate conductor from the semiconductor fin.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. Further, the mere fact that the various embodiments are described respectively does not necessarily mean that measures described in those embodiments cannot be used in combination to advantages.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

What is claimed is:

1. A FinFET, comprising:
   a semiconductor fin;
   a source region and a drain region disposed in the semiconductor fin;
   a shielding layer disposed on one of the source region and the drain region, the shielding layer having a sidewall opposed to the other one of the source region and the drain region; and
   a gate stack disposed between the source region and the drain region, the gate stack comprising a gate dielectric and a gate conductor, wherein the gate dielectric separates the gate conductor from the semiconductor fin, and extends only on a bottom surface of the gate conductor and on a surface on which said sidewall of the shielding layer is located.

2. The FinFET of claim 1, wherein the shielding layer constitutes a part of an interlayer insulating layer.

* * * * *